United States Patent [19]
Takahashi et al.

[11] 4,294,000
[45] Oct. 13, 1981

[54] MACHINE FOR INSERTING ELECTRONIC COMPONENTS

[75] Inventors: Tetsuo Takahashi; Yoshinobu Taguchi; Kotaro Harigane; Tetsuro Ito; Akihiro Kato, all of Tokyo, Japan

[73] Assignee: Tokyo Denki Kogaku Kogyo Kabushiki Kaisha, Japan

[21] Appl. No.: 34,014

[22] Filed: Apr. 27, 1979

[30] Foreign Application Priority Data

May 2, 1978 [JP] Japan ................... 53-53161

[51] Int. Cl.³ .................... H05K 3/32; H05K 13/02
[52] U.S. Cl. ............................. 29/564.6; 29/566.2; 29/566.3; 29/741
[58] Field of Search ............ 29/741, 564.1, 564.2, 29/33 M, 564.6, 566.1, 566.2, 566.3

[56] References Cited

U.S. PATENT DOCUMENTS

| | | | |
|---|---|---|---|
| 3,594,889 | 7/1971 | Clark | 29/741 X |
| 3,636,624 | 1/1972 | Bates | 29/741 X |
| 4,054,988 | 10/1977 | Masuzima | 29/741 X |
| 4,087,034 | 5/1978 | Kikkawa | 29/564.1 |
| 4,177,549 | 12/1979 | Mori et al. | 29/564.2 |
| 4,196,513 | 4/1980 | Harigane et al. | 29/741 |
| 4,197,638 | 4/1980 | Asai | 29/741 |

Primary Examiner—William R. Briggs
Attorney, Agent, or Firm—Steinberg & Raskin

[57] ABSTRACT

An insert sub-assembly of an insert device of a machine for processing and inserting parallel lead electronic components from an electronic component web carrier into lead receiving openings in a printed circuit board includes a first slider device slidably mounted on a frame. A driver mounted on the frame drives the first slider device. A second slider device slidably mounted on the frame cooperates with movement of the first slider device and includes a lead holding and guiding device for holding and guiding an electronic component and a push bar for displacing the component from a predetermined position to an inserted position under the control of the lead holding and guiding device. A feed device mounted on the frame is driven by an intermittent drive to feed the electronic component web carrier intermittently, pitch by pitch. A cutter separates one electronic component from the electronic component web carrier fed by the feed device. A transfer device includes a reciprocating unit for producing reciprocative movements between the cutter and the lead holding and guiding device and an electronic component holding device for holding a lead of the electronic component to be separated by the cutter and transferring the component to the lead holding and guiding device after such component has been separated by the cutter.

15 Claims, 39 Drawing Figures

FIG. 17
FIG. 18
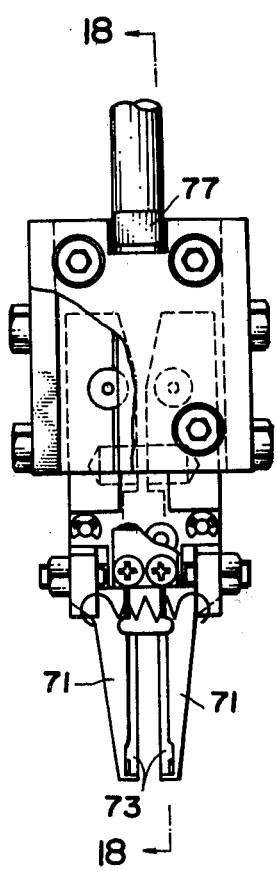
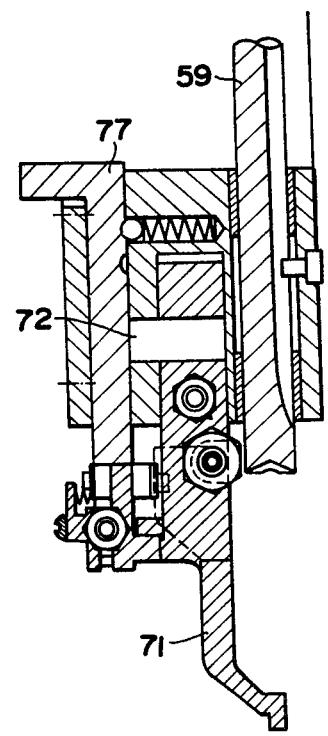

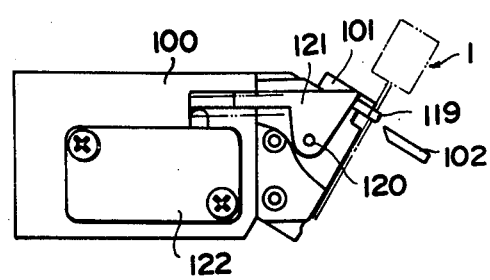
FIG. 26
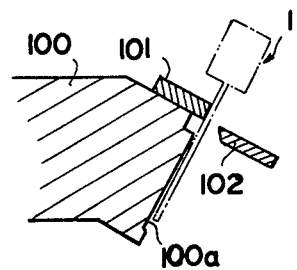
FIG. 27
FIG. 28
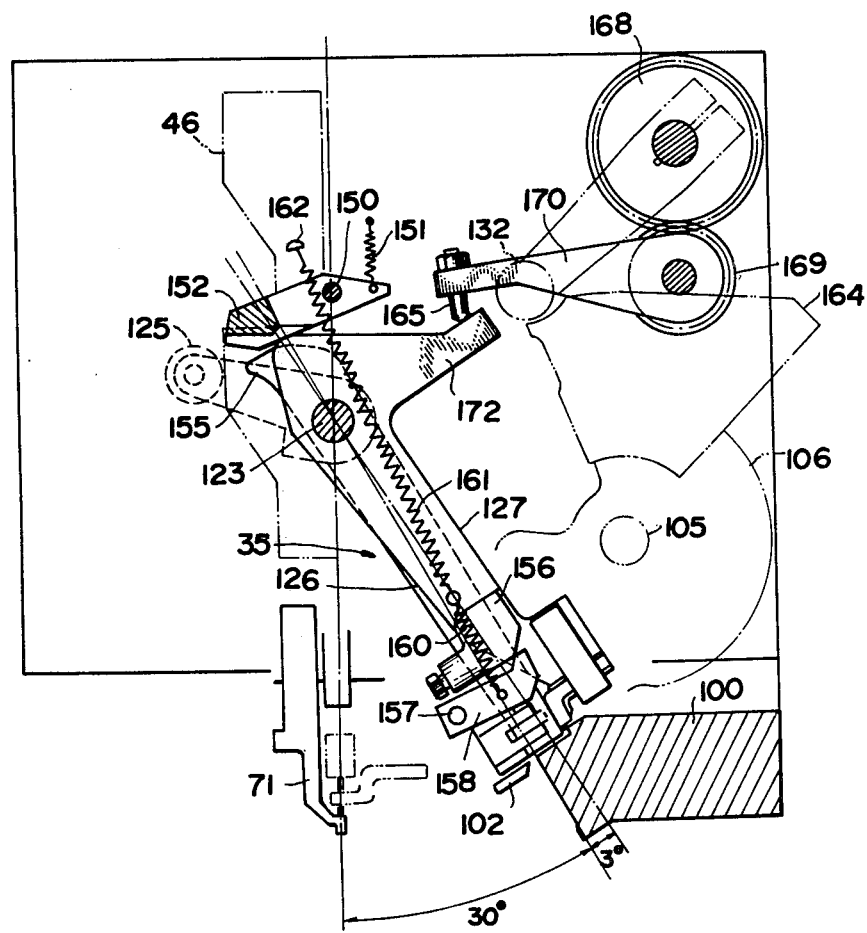

MACHINE FOR INSERTING ELECTRONIC COMPONENTS

BACKGROUND OF THE INVENTION

The present invention relates to a machine for processing and inserting parallel lead electronic components into a printed circuit board.

SUMMARY OF THE INVENTION

A machine for processing and securing parallel lead electronic circuit elements to a printed circuit board is disclosed in U.S. Pat. No. 4,054,988 of Sho Masuzima et al. An automatic inserting machine of the type disclosed in the aforedescribed patent is excellent compared to inserting machines of the conventional techniques with respect to the inserting speed and reliability. However, since many kinds of electronic components are respectively selected and separated for insertion by one machine, a certain time is necessary for this selection and it is very difficult to shorten the operation time required for insertion of one electronic component.

If the automatic inserting machine is constructed so that one web carrier of electronic components is processed by one machine and a plurality of such inserting machines are arranged in series, it is possible to insert different types of electronic components in sequence. The speed of insertion of electronic components may be increased over the inserting speed attainable by the machine disclosed in the aforedescribed patent. That is, the inserting capacity is increased and the reliability of the inserting operation is greatly enhanced.

The principal object of the invention is to provide a machine for inserting parallel lead electronic components into lead receiving openings of a printed circuit board with rapidity.

An object of the invention is to provide a machine for automatically inserting electronic components into a printed circuit board at a greater speed than that attainable by the machine disclosed in U.S. Pat. No. 4,054,988.

Another object of the invention is to provide a machine of small size and light weight for automatically inserting electronic components into a printed circuit board.

Still another object of the invention is to provide a machine of small size and light weight for automatically inserting electronic components into a printed circuit board at a speed greater than that attainable by U.S. Pat. No. 4,054,988.

Yet another object of the invention is to provide a machine for automatically inserting electronic components into a printed circuit board at a speed of approximately ⅛ to ¼ second per component.

Another object of the invention is to provide a machine for automatically inserting electronic components into a printed circuit board with great operational capacity and with great reliability.

In accordance with the invention, a machine for processing and inserting parallel lead electronic components from an electronic component web carrier into lead receiving openings in a printed circuit board includes an insert device for receiving an electronic component at a predetermined position and inserting the electronic component into the printed circuit board. The inserting device includes an insert sub-assembly having a frame. A first slider device is slidably mounted on the frame. A driving device is mounted on the frame for driving the first slider device. A second slider device is slidably mounted on the frame and cooperates with movement of the first slider device. The second slider device includes a lead inserting and guiding device for holding and guiding the electronic component and a push bar for displacing the electronic component from the predetermined position to an insert position under the control of the lead inserting and guiding device. A feed device mounted on the frame is driven by an intermittent drive to feed the electronic component web carrier intermittently, pitch by pitch. A cutter separates one electronic component from the electronic component web carrier fed by the device. A transfer device includes a reciprocating unit for producing reciprocative movements between the cutter and the lead inserting and guiding device and an electronic component holding device for holding a lead of the electronic component to be separated by the cutter and transferring the electronic component to the lead inserting and guiding device after the electronic component has been separated by the cutter.

BRIEF DESCRIPTION OF THE DRAWINGS

For a fuller understanding of the invention, reference is had to the following description, taken in connection with the accompanying drawings, in which:

FIG. 17 is a front view of an embodiment of the inserting and guiding device of the insert sub-assembly of FIG. 15;

FIG. 18 is a cross-sectional view, taken along the lines 18—18, of FIG. 17;

FIG. 26 is a view, taken along the lines 26—26, of FIG. 25;

FIG. 27 is a view, partly in section, taken along the lines 27—27, of FIG. 25;

FIG. 28 is a side view of an embodiment of the chuck lever of the transfer device of the invention in a stage of operation;

DESCRIPTION OF PREFERRED EMBODIMENTS

The present invention relates to an automatic inserting machine for separating electronic components such as condensers, resistances, diodes, transistors, or the like, from electronic component web carriers of radial lead electronic components or parallel lead electronic components where one of the axial leads is bent by 180° and made parallel to the other axial lead, and inserting the separated electronic components into lead insert holes of a printed circuit board, or the like.

Figure 1:
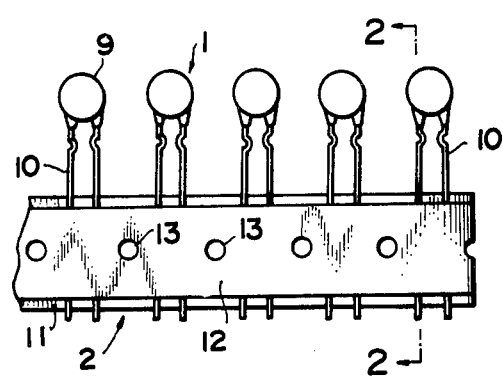
FIG. 1 is a plan view of an example of an electronic component web carrier of the prior art.
Figure 2:
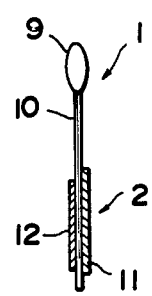
FIG. 2 is a sectional view, taken along the lines 2—2, of FIG. 1.
Figure 3:
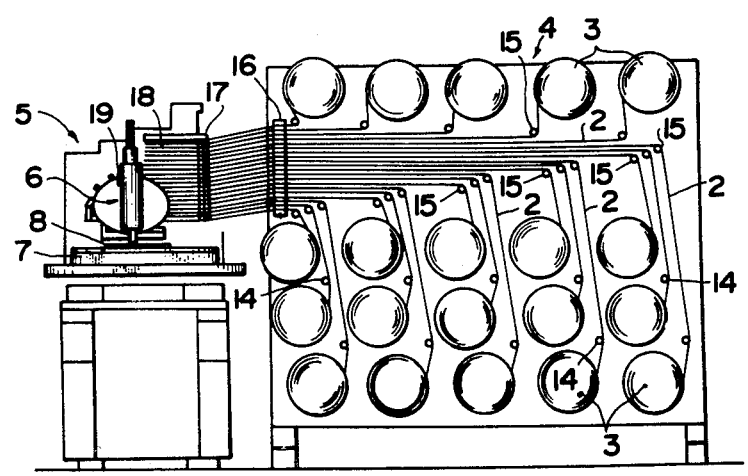
FIG. 3 is a front view of an example of an automatic inserting machine of the prior art.

In the recently developed machine for inserting electronic components in a printed circuit board, disclosed in U.S. Pat. No. 4,054,988, an electronic component web carrier 2 including a series of many electronic components 1, as shown in FIG. 1, is wound on a reel 3. A plurality of such reels 3 are held on a holding plate 4, as shown in FIG. 3. The electronic component web carriers 2, unwound and removed from the respective reels 3, are guided to an automatic inserting machine 5 to cut the respective electronic components from said electronic component web carriers. The separated electronic components 1 are held by the top end of an insert device 6 and inserted into predetermined holes of a printed circuit board 8 placed on a table 7.

In the electronic component web carrier 2, leads 10 from electronic components 9 are bonded to a holding web 11 by adhesive tape 12 and affixed to said web equidistantly in parallel relation with each other. Positioning and feeding holes 13 are equidistantly formed in the electronic component web carrier 2.

When a great number of electronic components are inserted in one printed circuit board 8, a great number of reels 3 on which web carriers of many different kinds of electronic components are wound, respectively, are arranged on the holding plate 4, as shown in FIG. 3. The electronic component web carriers removed from the reels 3 are introduced into the insert device via guides 16 and 17 by means of guide rollers 14 and feed rollers 15 and said carriers are positioned on receiving shelves 18. Then, according to instructions of a program, electronic components of a predetermined electronic component web carrier are separated therefrom and transferred and fed to the insert device 6 by a transfer device 19. The predetermined electronic components are then inserted into predetermined holes of the printed circuit board.

The machine of the invention is now described in detail with reference to the embodiments illustrated in the accompanying drawings.

Figure 4:
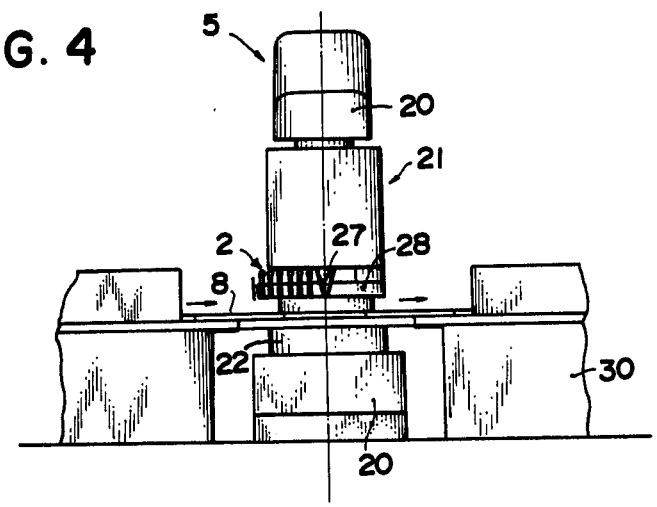
FIG. 4 is a front view of an embodiment of the machine of the invention.
Figure 5:
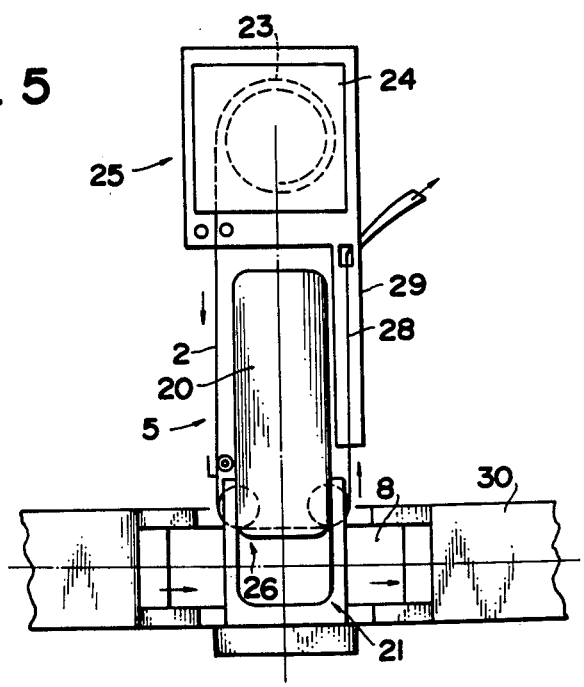
FIG. 5 is a plan view of the embodiment of FIG. 4 of the machine of the invention.
Figure 6:
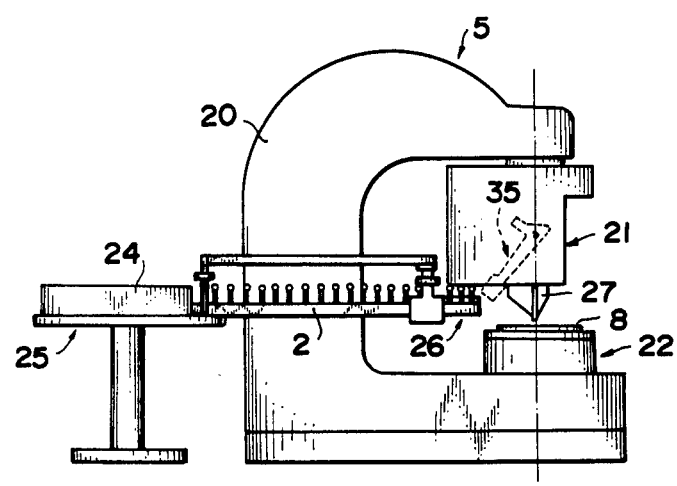
FIG. 6 is a side view of the embodiment of FIG. 4 of the machine of the invention.

As shown in FIGS. 4, 5 and 6, the automatic inserting machine 5, including the insert device of the present invention, comprises a unit 25 for containing electronic components therein, an insert unit 21 supported an a machine frame 20 and a table unit 22. A carton 24 containing reel 23 of an electronic component web carrier 2, as shown in FIG. 1, is mounted on the containing unit 25. The containing unit 25 is disposed to feed the electronic component web carrier 2 to the automatic inserting machine 5. The electronic component web carrier 2 removed from the reel 23 is introduced into a feed device 26 of the automatic inserting machine 5, and respective electronic components are separated from the web carrier 2 and transferred to an inserting and guiding device 27 by a transfer device 35. The electronic components are inserted into predetermined holes of a printed circuit board 8 placed on the table unit 22 by the inserting and guiding device 27.

The remaining web carrier 28 from which the electronic components have been separated is guided onto a gutter 29 and discharged outside. The printed circuit boards 8 in which the predetermined electronic components have been inserted are delivered to a table 30 by a known delivery unit and are fed to subsequent stages in sequence.

Figure 7:
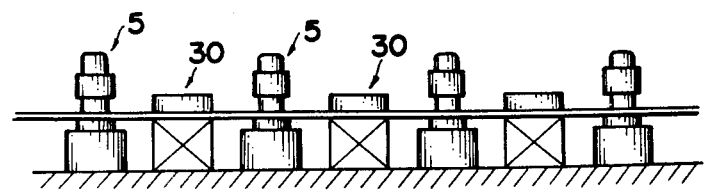
FIG. 7 is a front view illustrating the layout of a plurality of machines of the embodiment of FIG. 4 arranged in series.

FIG. 7 illustrates a layout in which a plurality of automatic inserting machines of the invention are arranged in a line in series.

Figure 8:
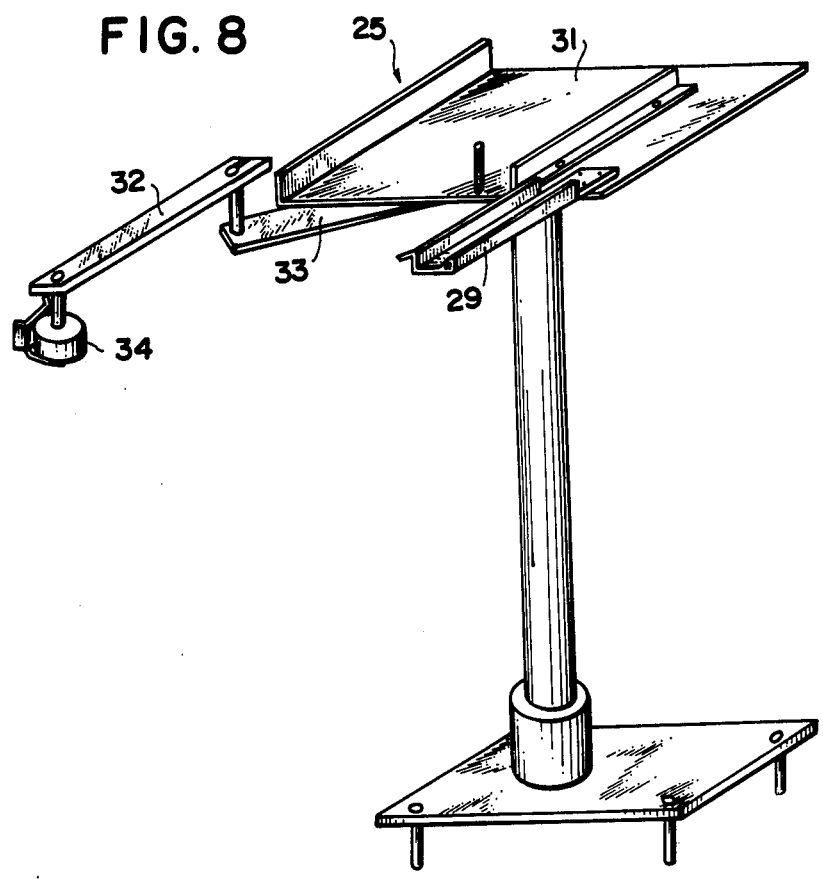
FIG. 8 is a perspective view of an embodiment of the feed device of the machine of the invention for feeding the electronic component web carrier.
Figure 9:
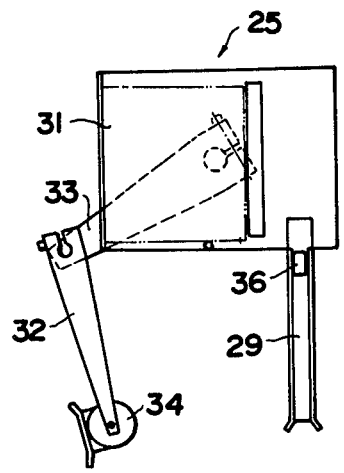
FIG. 9 is a front view of the feed device of the embodiment of FIG. 8.

FIGS. 8 and 9 illustrate an embodiment of the electronic component containing unit 25. The containing unit 25 comprises a plate portion 31 on which the carton 24 containing an electronic component web carrier is placed. The carton 24 is not shown in FIGS. 8 and 9. Arms 32 and 33 and a guide roller 34 guide the electronic component web carrier 2 (FIG. 1) to be fed to the insert unit 21. A gutter 29 guides the web carrier 28, not shown in FIGS. 8 and 9, from which electronic components have been separated. A hole 36 is disposed to discharge the web carrier 28 to the outside.

The insert unit 21 of the invention will now be described in detail. As shown in FIGS. 10 to 14, the insert unit or device 21 comprises a unit frame 37 hung from the machine frame 20.

An upper slider frame member 38 comprises a frame 39 and a bracket 40. A ball bushing 42 is mounted on the frame 39 and is slidably supported along a guide shaft 41 affixed to the unit frame 37. A rod 43 having a spherical joint is vertically moved via other known drive means such as, for example, directly by a cylinder or through a link mechanism. Affixed to the upper slider frame member 38 are a cam 44 for vertically moving a push bar, a cam 45 for vertically moving a lower slider frame member, a chuck lever return cam 46, a cam 47 for opening and closing an insert guide and a push bar fixing cam 48.

A lower slider frame member 49 comprises a frame 50 as the base member on which the inserting and guiding device 27 and a push bar member 52 are mounted. The inserting and guiding device 27 holds and guides a lead of an electronic component when it is inserted into the printed circuit board. The push bar member 52 pushes the head of the electronic component in the inserting step. The lower slider frame member 49 is hung down by a link 54 connected to a bell crank 53. The bell crank 53 is swung on a fulcrum 56 formed on the unit frame 37 via a roller 55 by the cam 45 for vertically moving the lower slider frame member. Thus, the lower slider frame member 49 is moved in a vertical direction along the contour of the cam 45 with the vertical movement of the upper slider frame member 38.

The push bar member 52 includes a sleeve 57, an upper push bar 58 and a lower push bar 59. The sleeve 57 is arranged so that it can be vertically moved along a guide groove 60 by a guide roller 61. A roller 65 is moved by the cam 44 for vertically moving the push bar through a bell crank 64 swingably supported at a fulcrum 63 of a bracket 62 affixed to the frame 50. The push bar member is thereby moved in a vertical direction.

A crank 66 is disposed to fix the upper push bar 58 to the sleeve 57 and is supported on a fulcrum 67 on said sleeve. A spring 68 provides a force for pressing the upper push bar 58 to the crank 66. The crank 66 is arranged so that while a roller 69 abuts the push bar fixing cam 48, there is a clearance and the upper push bar 58 is not pressed. However, when the roller 69 separates from the push bar fixing cam 48 by a relative movement between the upper slider frame member 38 and the sleeve 57, the upper push bar 58 is pressed.

A spring 173 is disposed to move the upper push bar 58 and the lower push bar 59 integrally with the sleeve 57. Incidentally, the spring 173 is bent when overloaded to release overloading.

An embodiment of the inserting and guiding device 27 is illustrated in FIGS. 15 to 18. The inserting and guiding device 27 may comprise a structure as shown in U.S. Pat. No. 4,054,988, United States pending patent application Ser. No. 890,151, DT-OS 2614002 or DT-OS 2744552. In the embodiment of the inserting and guiding device 27 illustrated in FIGS. 15 to 18, a block 70 affixed to the frame 50 constitutes a basic member and a pair of inserting guides 71 are swingably or pivotally supported thereon via a center pin 72. A guide piece 73 is affixed to the inside of each of the inserting guides 71, so that said guide pieces may rotate in directions perpendicular to the opening direction of said inserting guides, and the lead of the electronic component is held between said two guide pieces.

When the inserting guide opening and closing cam 47 affixed to the upper slider frame member 38 is brought down to abut a roller 75, a guide opening lever 76 is rotated to push up an operation rod 77, whereby the guide pieces 73 are rotated and the inserting guides 71 are opened. When the upper slider frame member 38 is lifted up and the inserting guide opening and closing cam 47 separates from the roller 75, the operation rod 77 is brought down by a guide closing lever 78. The inserting guides 71 are thereby closed and the guide pieces 73 are returned to the original positions.

A bearing 79 is provided in the block 70 to guide the lower push bar 59. A rotation-preventing bolt 80 is also provided.

Figure 11:
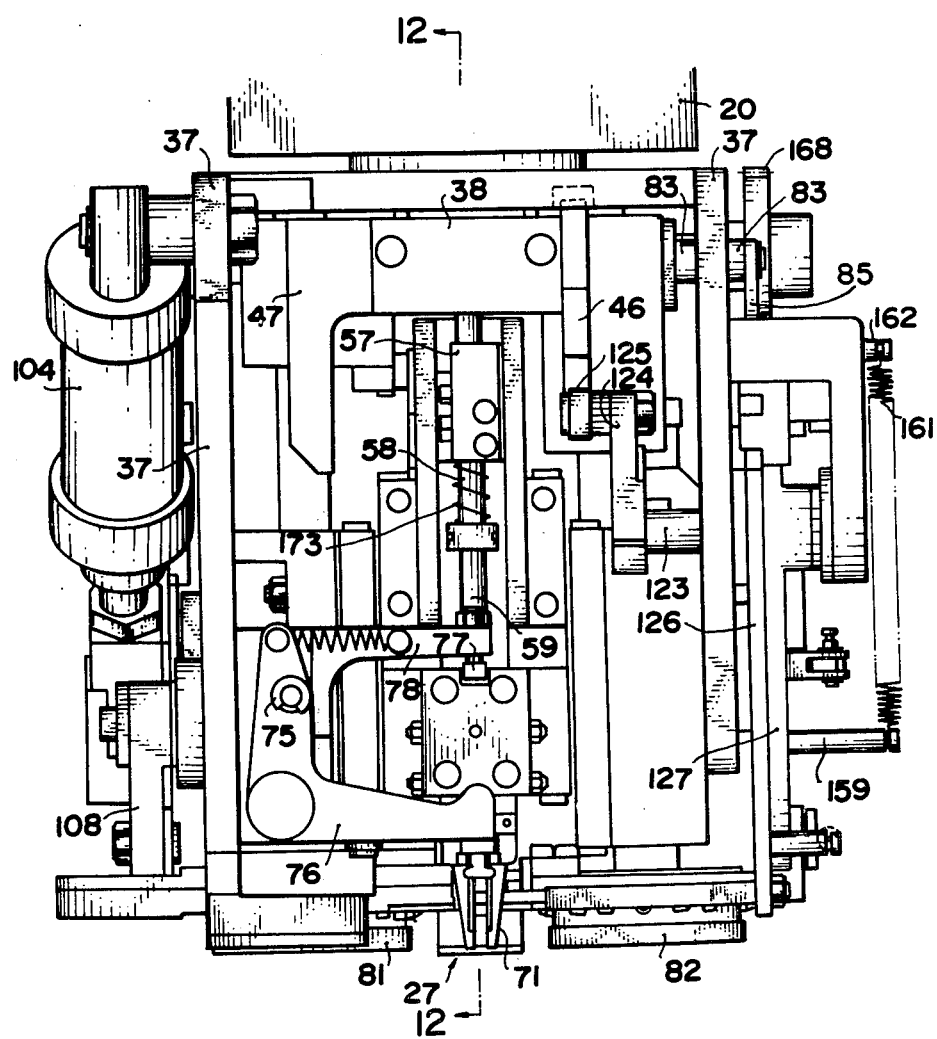
FIG. 11 is a front view of the insert unit of the embodiment of FIG. 10.
Figure 12:
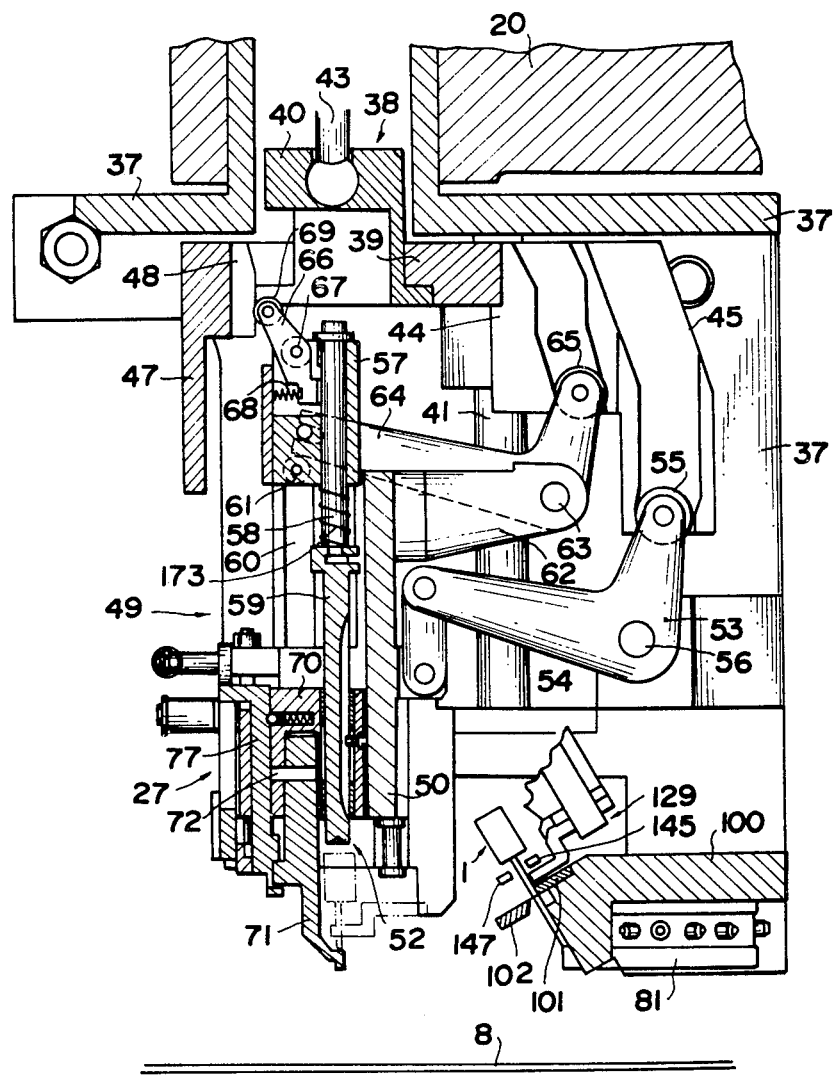
FIG. 12 is a view, partly in section, taken along the lines 12—12, of FIG. 11.
Figure 13:
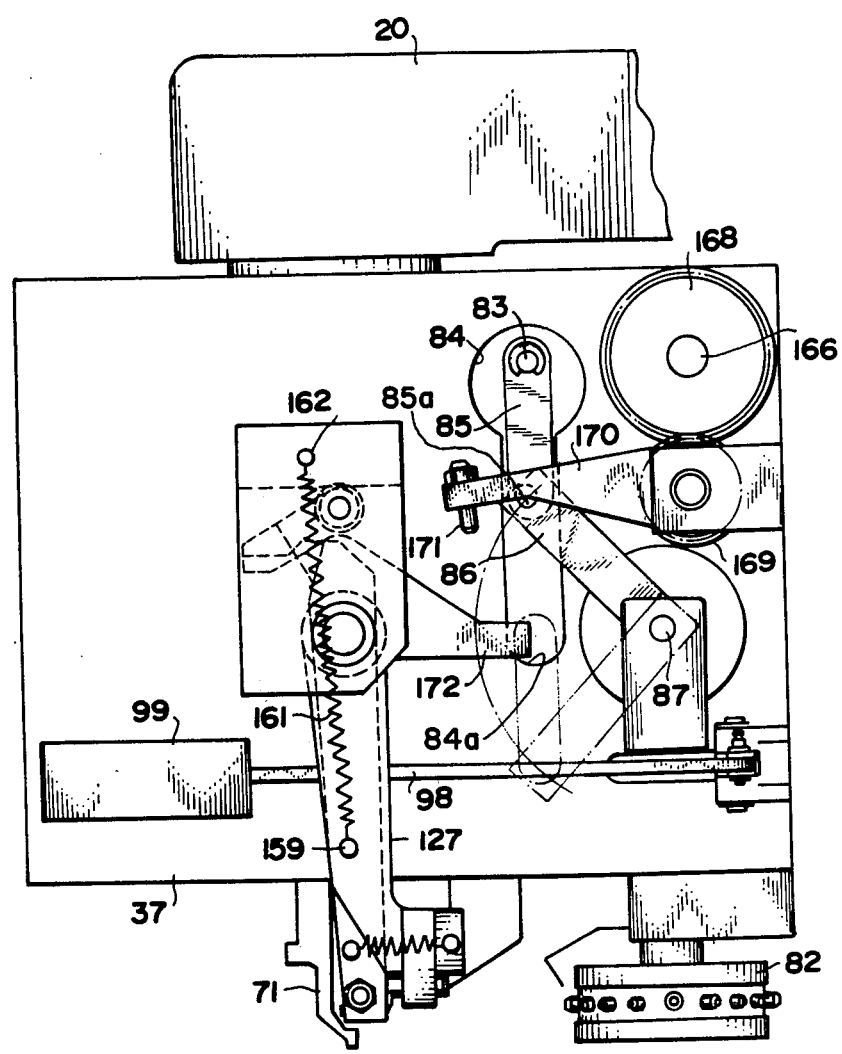
FIG. 13 is a right side view of the insert unit of the embodiment of FIG. 10.
Figure 14:
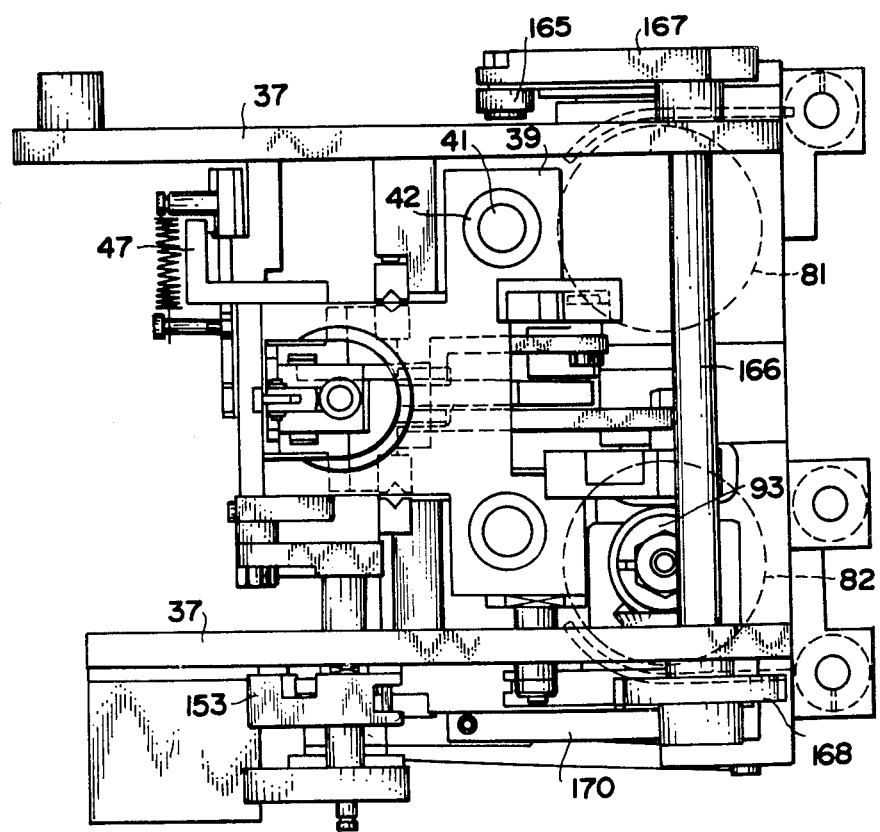
FIG. 14 is a plan view of the insert unit of the embodiment of FIG. 10.
Figure 15:
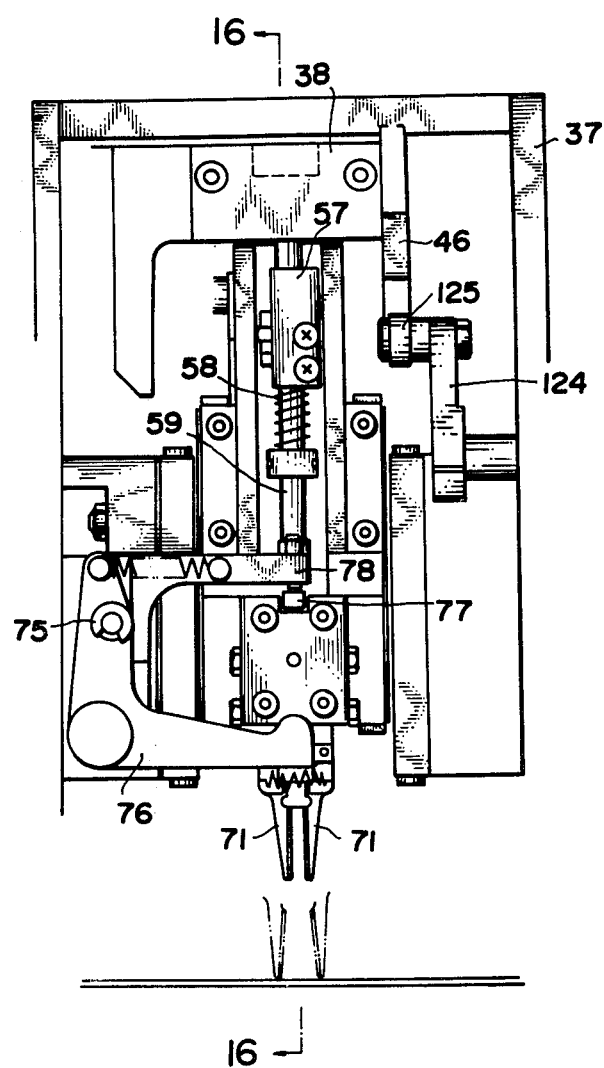
FIG. 15 is a front view of an embodiment of the insert sub-assembly of the insert unit of FIG. 10.
Figure 16:
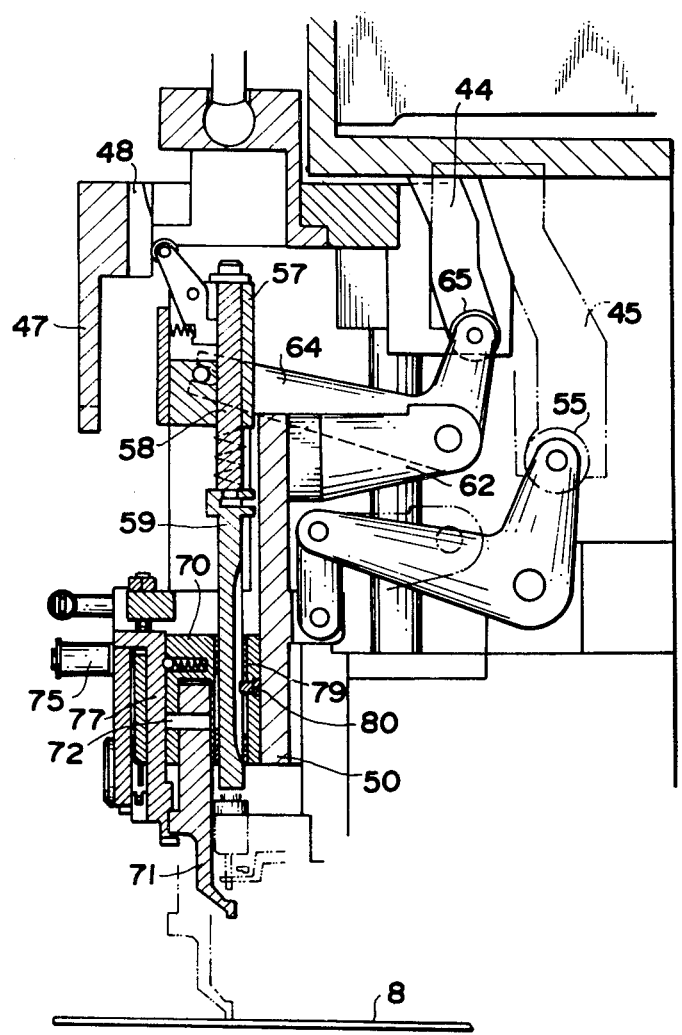
FIG. 16 is a view, partly in section, taken along the lines 16—16, of FIG. 15.
Figure 19:
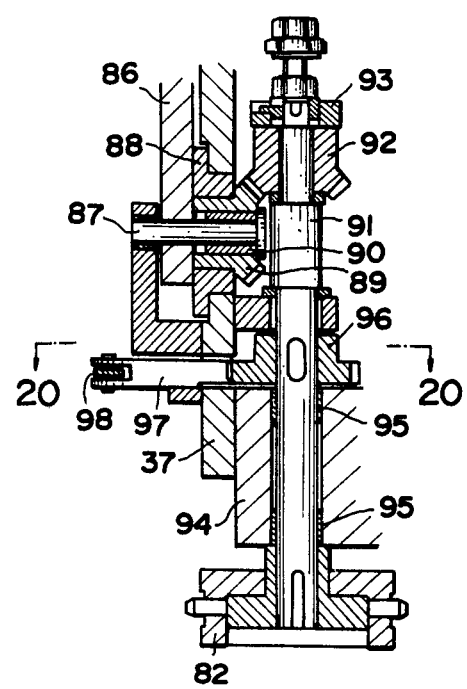
FIG. 19 is a longitudinal view, partly in section, illustrating the ratchet wheel shaft of the insert unit.
Figure 21:
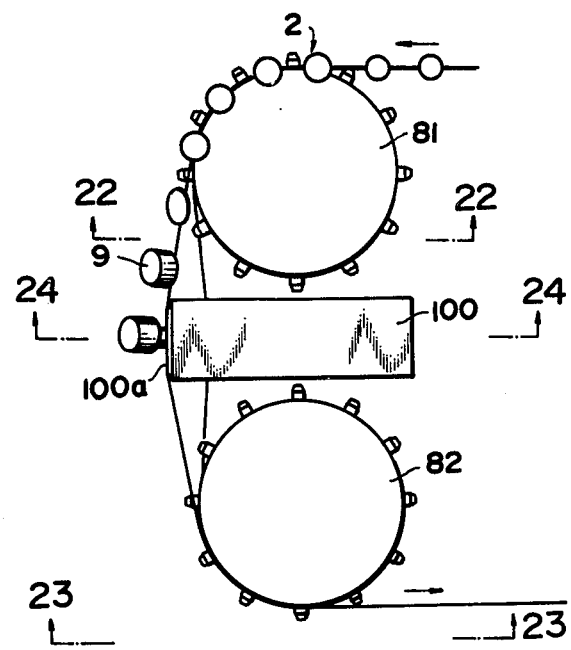
FIG. 21 is a plan view of the ratchet wheel of the insert unit.

The feed device 26 for feeding the electronic component web carrier 2 is a mechanism for intermittently driving one of two ratchet wheels 81 and 82 for guiding and feeding the electronic component web carrier 2, as shown in FIG. 21. The source of the driving force is the vertical movement of the upper slider frame member 38. As shown in FIG. 11, a connecting pin 83 is disposed on the upper slider frame member 38 to extend outwardly through the side plate of the unit frame 37. As shown in FIG. 13, the connecting pin 83 is arranged so that it is not permitted to move within a hole 84 having a keyhole-like shape which terminates at a lower end 84a. Link 85 is connected at its upper end to the connecting pin 83. A link 86 is pivotally connected at one end to the lower end of link 85 by pin 85a and is connected at its other end to a rotatable shaft 87 so that a vertical movement of the connecting pin 83 results in the link 86 being swung or pivoted to rotate the shaft 87. The shaft 87 is connected through a one-way clutch 90 to a bevel gear 89 supported in a bearing 88 affixed to the side plate of the unit frame 37, as shown in FIG. 19. The bevel gear 89 is engaged with a bevel gear 92 rotatably mounted around a vertical shaft 91. The bevel gear 92 is connected to the vertical shaft 91 through a slip clutch 93.

Figure 20:
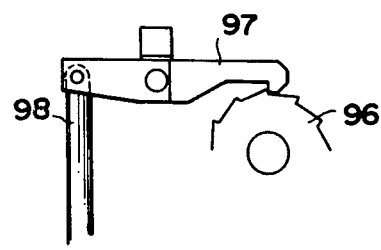
FIG. 20 is a view, taken along the lines 20—20, of FIG. 19.

The vertical shaft 91 is rotatably supported on a bearing 95 of a block 94 integrated with the unit frame 37. The ratchet wheel 82 is affixed to the lower end of the vertical shaft 91. As shown in FIG. 20, reference numerals 96, 97 and 98 represent a ratchet, a ratchet stopper and a connecting link, respectively, and they are operated by a solenoid 99, as shown in FIG. 13. The solenoid 99 is actuated by a limit switch (not shown) when the upper slider frame member 38 arrives at the lowermost position, i.e., the lower end of its stroke, to draw the connecting link 98 and open the ratchet 96.

Figure 22:
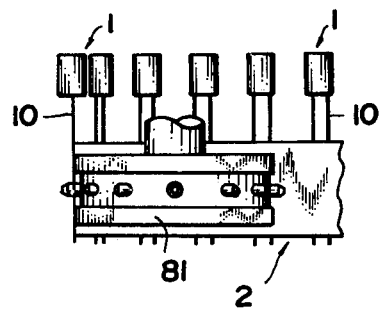
FIG. 22 is a view, taken along the lines 22—22, of FIG. 21.
Figure 23:
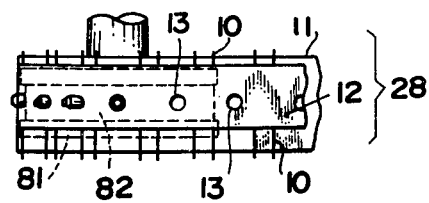
FIG. 23 is a view, taken along the lines 23—23, of FIG. 21.

The feeding of the electronic component web carrier is illustrated in FIGS. 21, 22 and 23.

Figure 24:
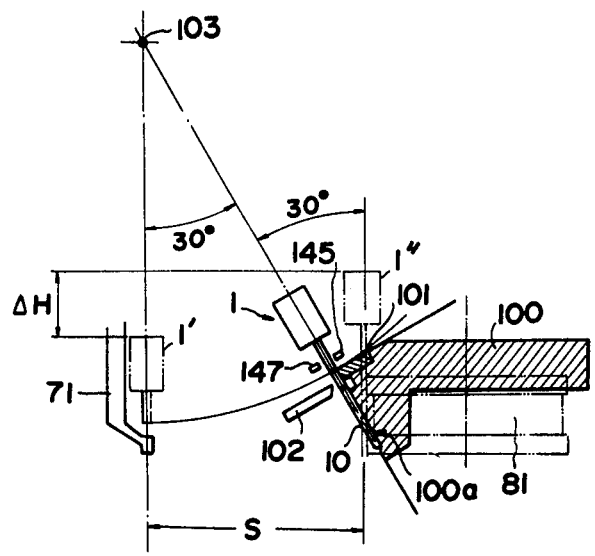
FIG. 24 is a view, partly in section, taken along the lines 24—24, of FIG. 21.

The cutting of the lead 10 into a predetermined length will now be described. As shown in FIGS. 21 and 24, a guide block 100 having a front wall inclined to the vertical at a predetermined angle such as, for example, 30° in the present embodiment, to form a guide face 100a, is disposed between the ratchet wheels 81 and 82. The face of the electronic component web carrier 2, which is maintained substantially vertical by the ratchet wheels 81 and 82, is inclined by 30° when it abuts the guide block 100. The condition is then that shown in FIG. 24.

The electronic component 1 is held by a chuck mechanism, described hereinafter, which is included in the transfer device 35. The lead 10 of the electronic component is cut in the predetermined length by a cutter 102 moved to a fixed blade 101 by a mechanism described hereinafter. Then, only the lead portion is transferred to the position of the inserting guides 71, according to a rotary movement of a central shaft 103 by means of the chuck mechanism, and an electronic component 1' is then in a position shown by broken lines in FIG. 24.

It is preferred that the angle of inclination of the electronic component web carrier guide face 100a of the guide block 100 be 15° to 45°, and, more specifically, 25° to 35°. Since the guide face 100a is thus inclined to the vertical and transfer of the electronic component 1 having the lead 10 cut in the predetermined length to the inserting guides 71 is due to the rotary movement of the central shaft 103, an electronic component 1", indicated by broken lines in FIG. 24, fed vertically by the ratchet wheel 81, may be transferred to said inserting guides in the position of the electronic component 1' kept vertical, but lowered by a distance ΔH after horizontal movement for a distance S.

More particularly, the electronic component is brought down by the distance ΔH while it is moved horizontally a distance S. Accordingly, the stroke of the inserting guides 71 may be correspondingly reduced and the size of the entire structure may be diminished. Furthermore, since the transfer device is a rotating, swinging, reciprocating mechanism, the structure is considerably simplified and electronic components may be transferred at very high speed with great and improved reliability.

Figure 25:
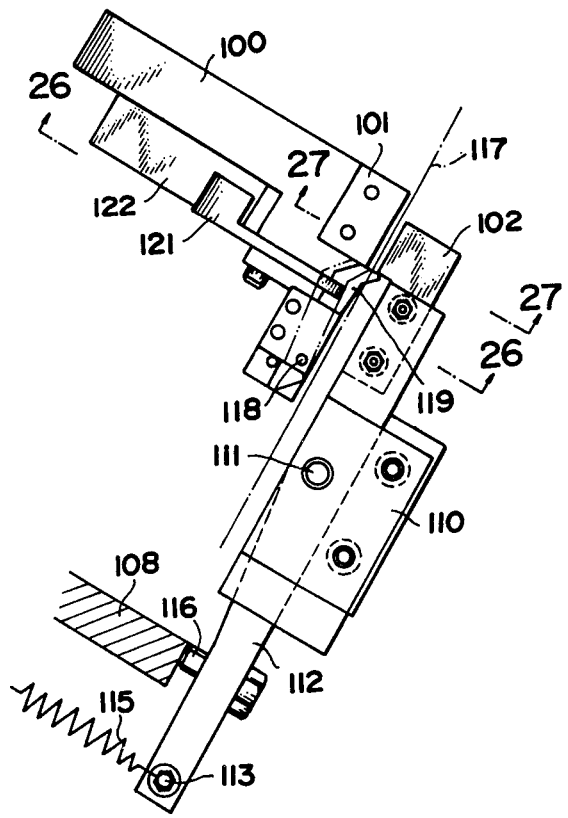
FIG. 25 is a plan view of an embodiment of the cutting device of the machine of the invention.

The cutter for cutting the lead 10 into the predetermined length will now be described with reference to FIGS. 10, 25, 26 and 27. A cam operating cylinder 104, pivoted on the unit frame 37, is connected to a cutting cam 106 having a central shaft 105 on said unit frame and a roller 109 of a lever 108. The lever 108 has a rotary shaft 107, on which the roller 109 is mounted, on the unit frame 37. The roller 109 is positioned contiguously to the cutting cam 106. As shown in FIG. 25, a cutter arm 112 is swingably or pivotally supported around a fulcrum 111 formed on a bracket 110 affixed to the unit frame 37. A bolt 113 is mounted on one end of the cutter arm 112. A spring 115 is spread between the bolt 113 and a ring 114 around the central shaft 105 (FIG. 10), so that the tensile force of said spring 115 causes a bolt 116 mounted on the cutter arm 112 to abut the lever 108. The roller 109 (FIG. 10) is thus pressed against the cutting cam 106. A cutter 102 is affixed to the other end of the cutter arm 112 so that the lead of the electronic component located on the electronic component shifting line 117 is cut.

A tooth absence detecting lever 119, rotatable by a pin 118, is disposed on the side of the fixed blade 101. The lever 119 is projected, so that the top end thereof intersects the electronic component shifting line 117. A striker 121 is rotatably supported by a pin 120 (FIG. 26) and is positioned to strike the back face of the detecting lever 119. The striker 121 is positioned to fall into contact with a limit switch 122 for detecting the absence of teeth. The top end of the detecting lever 119 is always urged to intersect the electronic component shifting line 117 by the force of a spring built into the limit switch 122.

The transfer device 35 for transferring the electronic component 1 separated by the cutting device to the inserting and guiding device 27 is illustrated in FIGS. 28 to 35. The stages or steps of the transfer operation are illustrated in FIGS. 36a, 36b, 36c and 36d. The structure of the transfer device will now be described with reference to FIGS. 29, 30 and 33. The illustrated condition or stage of operation corresponds to the position shown in FIG. 36c.

A shaft 123 is rotatably mounted on the side plate of the unit frame 37. A lever 124 and a roller 125 are mounted on one end of the shaft 123 and said roller falls into contact with the chuck lever return cam 46. A wiper lever 126 is rotatably mounted on the other end of the shaft 123 and a chuck lever 127 is keyed and supported on said other end of said shaft.

Figure 33:
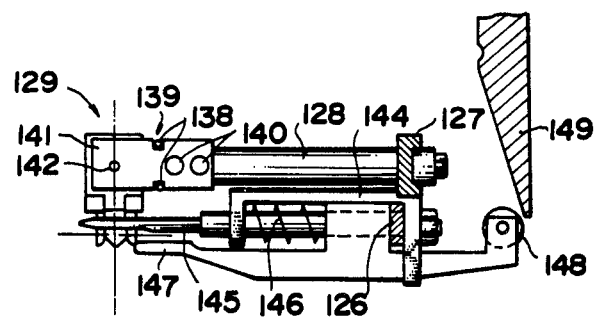
FIG. 33 is a front view of the chuck mechanism, wiper mechanism and lead press bar of the embodiment of FIG. 31 in still a different stage of operation.
Figure 34:
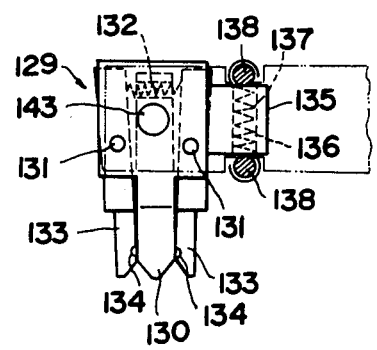
FIG. 34 is a front view, on an enlarged scale, of an embodiment of the chuck mechanism of the transfer device of the invention.
Figure 35:
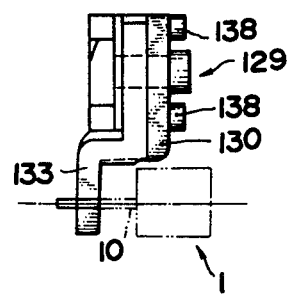
FIG. 35 is a side view of the chuck mechanism of the embodiment of FIG. 34.

As shown in FIG. 33, a horizontal bar 128 is affixed to the top end of the chuck lever 127. A chuck mechanism 129 is affixed to the top end of the bar 128. As shown in FIGS. 34 and 35, which illustrate the chuck mechanism 129 in detail, said chuck mechanism includes a fixed click or detent 130 and a pair of movable clicks or detents 133 disposed on both sides of said fixed click, so that they may be rotated by a pin 131. The top end of each movable click 133 is pressed to the top end of the fixed click 130 by a spring 132. A guide groove 134 is formed in each of the movable clicks 133, so that the lead 10 of the electronic component 1 is gripped by these grooves and is guided in this stage of operation. A part of the base of the fixed click 130 is laterally projected to form a bracket 135. A hole 136 is formed in the bracket 135 and a spring 137 is coupled to draw two vertically inserted pins 138 to each other and hold them in this condition. The chuck mechanism 129, having the aforedescribed structure, is affixed to a cover plate 141 through a hole 143 (FIG. 34) via a pin 142. The cover plate 141 has a pair of notches 139 formed in both sides thereof. The pins 138 are exposed in the notches 139. The cover plate 141 is affixed to the bar 128 by screws 140.

When the chuck mechanism 129 is pressed to the lead 10, the movable clicks 133 are opened. When the lead 10 is received in the guide grooves 134, said lead is held and gripped by the force of the spring 132. Accordingly, a particular member need not be disposed to apply a force from the outside to open and close the movable clicks 133. The structure of the chuck mechanism 129 may be simplified considerably, and the size and weight of said chuck mechanism may be diminished. The sizes of surrounding members may also be diminished. As a result, the speed of operation may be increased. Furthermore, since the pins 138 and the spring 137 are positioned in addition to the pin 142, the restraining force is sufficient. The restraint is accompanied by a restoring force. Thus, even if the position of the electronic component to be held and gripped deviates to some extent with respect to the chuck mechanism 129, the deviation may be compensated by said chuck mechanism and the electronic component 1 may be smoothly held and gripped without bending or damaging the lead 10. Furthermore, since some positional error is thus permitted, the positioning of the electronic component web carrier 2 may be greatly facilitated, and centering may be accomplished if only the lead 10 is cut. Therefore, occurrence of inserting lag caused by a difficulty due to the positional error may be effectively prevented.

Figure 31:
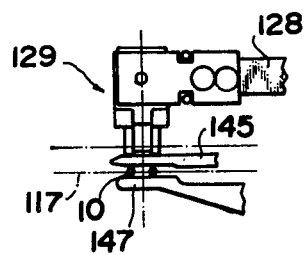
FIG. 31 is a front view of an embodiment of the chuck mechanism, the wiper mechanism and the lead press bar of the transfer device of the invention in a stage of operation.

As shown in FIG. 33, a bracket 144 is affixed to the wiper lever 126, and a wiper 145 is attached to this bracket 144. A lead press bar 147 is mounted on the wiper 145. The bar 147 may thus rotate around the wiper 145 and may slide along said wiper. The wiper 145 is subjected to the force of a spring 146 on one side thereof. A roller 148 is mounted on the terminal end of the lead press bar 147, so that said roller falls into contact with a lead press bar cam 149 affixed to the unit frame 37. An arrangement is made, so that when the top end of the lead press bar 147 is projected to the left in the drawing and the lead 10 is guided to the center between the top end of said lead press bar and the top end of the wiper 145, as shown in FIG. 31, a clearance of 0.2 to 0.7 mm is provided between said lead and said wiper and a clearance of 0.2 to 0.7 mm is provided between said lead and said lead press bar.

A delay cam mechanism and a phase difference cam mechanism may be used as a connecting mechanism for determining the positional relationship between the wiper lever 126 and the chuck lever 127. The delay cam mechanism is a mechanism which is arranged so that after the electronic component 1 has been transferred to the inserting guides 71, the chuck lever 127 first begins to return and the wiper lever 126 then begins to return. In the disclosed embodiment, the delay cam mechanism is particularly positioned. Therefore, when the chuck mechanism 129 retracts, even if said chuck mechanism will pull and bend the lead 10 of the electronic component 1' held by the inserting guides 71, since the wiper 145 still remains in its acting position, said lead is only slightly elastically deformed and moves to abut the wiper 145. Accordingly, further deformation of the lead 10 is prevented, and even if the chuck mechanism 129 is retracted at a high speed, said lead is not at all bent by said chuck mechanism. Furthermore, a particular mechanism need not be disposed to forcibly open and close the chuck mechanism 129 and it is possible to retract said chuck mechanism at a high speed by a simple structure, such as that hereinbefore mentioned.

Figure 29:
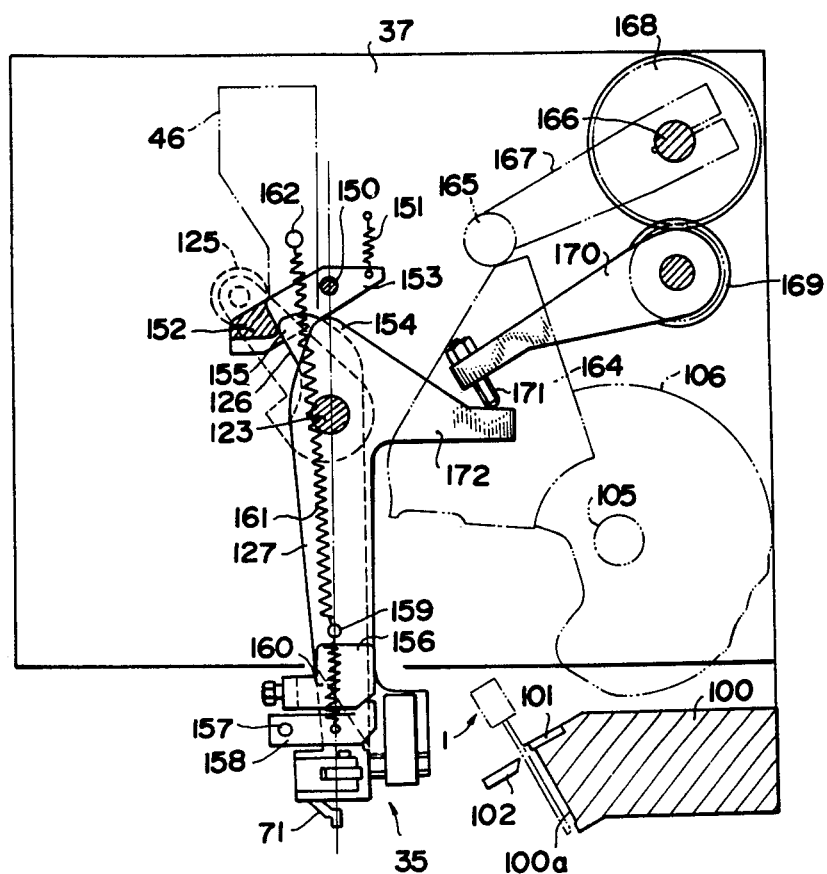
FIG. 29 is a side view of the chuck lever of the embodiment of FIG. 28 in a different stage of operation.
Figure 30:
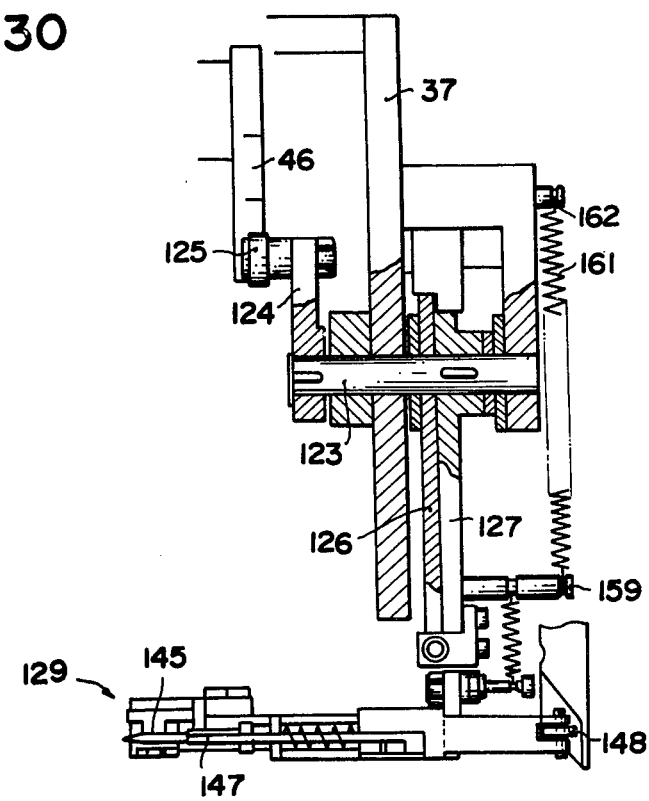
FIG. 30 is a front view, partly cutaway and partly in section, of the chuck lever in the stage of operation of FIG. 29.

The delay cam mechanism includes, as shown in FIG. 29, a cam lever 153 rotatably positioned around a fulcrum 150 formed on the unit frame 37 and having a stopper 152 at one end thereof, a spring 151 for imparting a torque to the cam lever 153, a projection 154 formed on the end portion of the chuck lever 127 and a hook 155 formed on the end portion of the wiper lever 126. The operation of the delay cam mechanism is hereinafter described.

The phase difference cam mechanism is a mechanism for simultaneously rotating the chuck lever 127 and the wiper lever 126 while maintaining a specific difference of the phase angle produced by the aforementioned delay cam mechanism. The phase difference cam mechanism includes a lock cam 156 affixed to the chuck lever 127, a lock lever 158 rotatably mounted around a pin 157 mounted on the wiper lever 126, and a spring 160 arranged to always bring said lock lever close to a pin 159 mounted on said chuck lever and cause said lock lever to fall into contact with said lock cam. The operation of the phase difference cam mechanism is hereinafter described.

A spring 161 extends between a pin 162 of the unit frame 37 and the pin 159 of the chuck lever 127, so that when no external force is applied to said chuck lever, said chuck lever is set at a vertical or other predetermined posture such as, for example, at a position of 33°, as hereinafter described.

Figure 10:
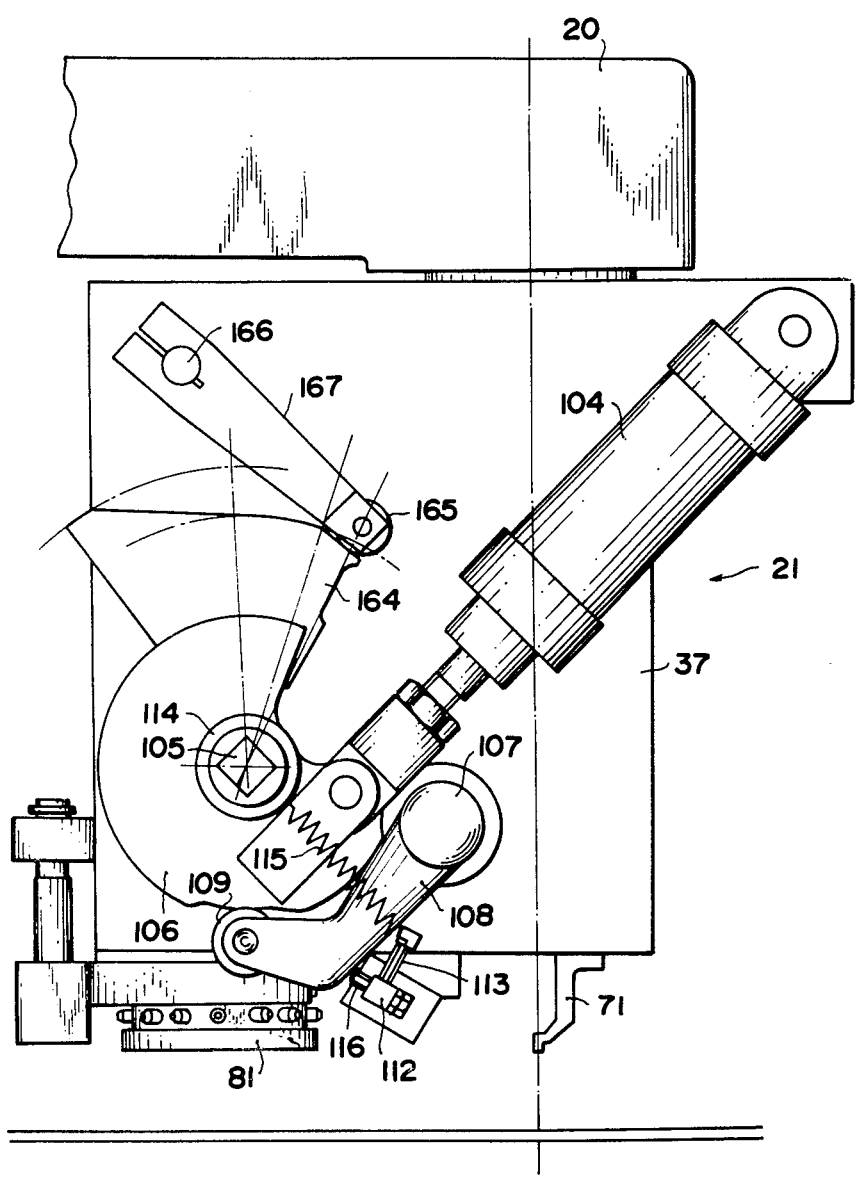
FIG. 10 is a left side view of an embodiment of the insert unit of the machine.

The mechanism for driving the chuck lever 127 will now be described. When the chuck lever 127 is fed out, or brought down, the cam operating cylinder 104 acts as the drive source, as shown in FIG. 10. The cam operating cylinder 104 includes a chuck feed-out cam 164 affixed to the central shaft 105, a roller 165 falling into contact with said cam, and a lever 167 affixed to a shaft 166. The shaft 166 pierces the opposite side of the unit frame 37, and a gear 168 is affixed to said shaft, as shown in FIG. 13. A gear 169 is engaged with the gear 168. A lever 170 is affixed to the gear 169. A push bolt 171 is affixed to the top end of the lever 170. The terminal portion of the chuck lever 127 is extended to form a crank lever 172.

The mechanism for returning, retracting or lifting up the chuck lever 127 includes the aforedescribed chuck lever return cam 46, the roller 125, the lever 124 (FIG. 30) and the shaft 123.

Figure 36A:
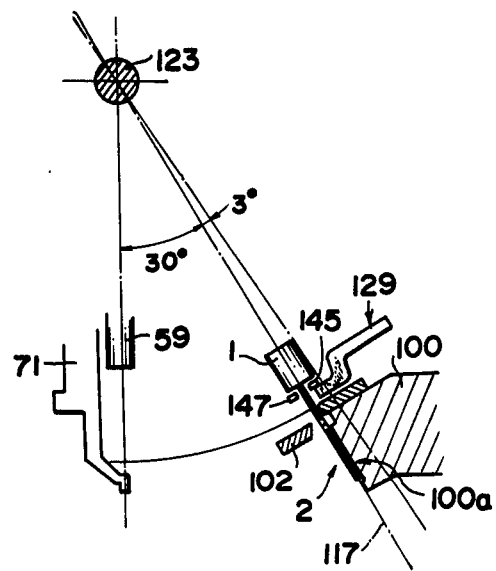
FIGS. 36a, 36b, 36c and 36d are schematic diagrams illustrating the stages of operation of the transfer device of the invention.
Figure 36B:
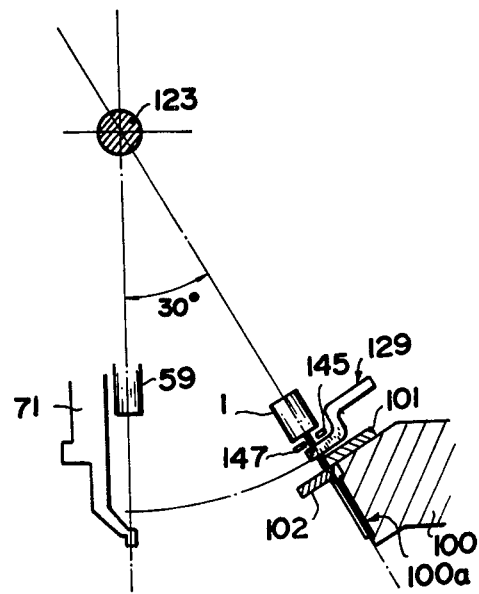

The operation of the transfer device 35 will now be described. FIG. 36a illustrates the stage of operation or condition in which the electronic component web carrier 2 is caused to abut the guide face 100a of the guide block 100 and is thereby inclined. At this point, the electronic components 1 are located on the electronic component shifting line 117 at a phase angle of 30°. This condition is also shown in the side view of FIG. 28 and the plan view of FIG. 31. In this stage or condition, the chuck lever return cam 46 is brought up, but the chuck lever 127 is set at a position corresponding to a phase angle of 33° by the force of the spring 161. Accordingly, a phase difference of 3° is maintained by the lock lever 158 which abuts the lock cam 156. The wiper lever 126 is therefore located at a position corresponding to a phase angle of 30° and the wiper 145 and lead press bar 147 stand by on both sides of the electronic component shifting line 117 at a phase angle 30°. In this condition, the electronic component 1 is guided between the wiper 145 and lead press bar 147. An arrangement is made so that at this point, the clearance between the lead 10 of the electronic component 1 and the wiper 145, and between said lead and the lead press bar 147 is adjusted to 0.2 to 0.7 mm, respectively.

Figure 32:
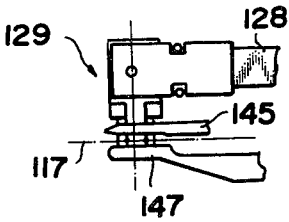
FIG. 32 is a front view of the chuck mechanism, wiper mechanism and lead press bar of the embodiment of FIG. 31 in a different stage of operation.

The cam operating cylinder 104 (FIG. 10) is then actuated to rotate the chuck feed-out cam 164, and the lever 170 is rotated via the aforedescribed mechanism, whereby the crank lever 172 is pressed and the chuck lever 127 is advanced by 3°. This stage or condition is shown in FIGS. 32 and 36a. Since the phase difference mechanism moves in a coming-off direction, the wiper lever 126 stops at a position corresponding to a phase angle of 30°. At this point, the chuck mechanism 129 presses the lead 10 and the movable clicks 133 are opened by the force thereby provided. Accordingly, the pressing force is imposed on the lead 10. However, since the lead press bar 147 is located just behind the lead 10, only a slight elastic deformation is produced in said lead and no high stress or further deformation is caused in said lead. In this stage, the lead 10 is held and gripped by the chuck mechanism 129. By virtue of the aforedescribed operational function, a particular opening and closing mechanism need be disposed for the chuck mechanism 129 and the operation may be performed at a high speed by a simple mechanism of the aforedescribed type, of small size and light weight.

Simultaneously with the aforedescribed operation, the cutter 102 is moved by the action of the cutting cam 106 and an excessive portion of the lead 10 is cut off. At this point, since the cutter 102 is located at a position lower than the position of the fixed blade 101, the lead 10 will bend in the falling direction under a lever action due to the pressing force of the cutter 102. However, this bending movement is restricted by a reaction of the lead press bar 147, and breakage or bending of the lead 10 is prevented. As a result, cutting may be reliably performed at a high speed.

Figure 36C:
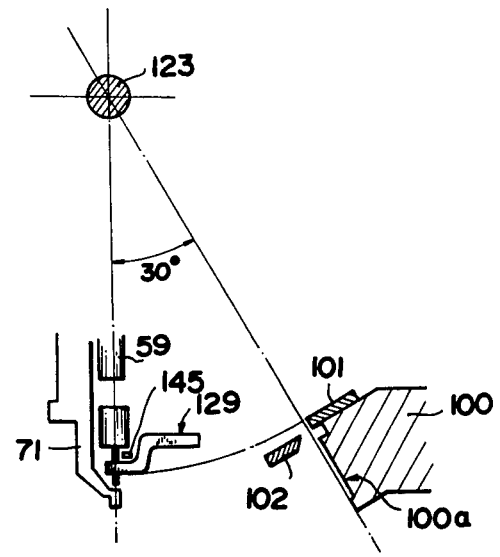

The cam operating cylinder 104 is then elongated to reduce the phase angle to zero, and the electronic component is delivered in a vertical position by the chuck mechanism 129. This condition is shown in FIGS. 36c, 29 and 33. At this point, as shown in FIGS. 33 and 36c, since the roller 148 moves away from the lead press bar cam 149, the lead press bar 147 is retracted. The upper slider frame member 38 then begins to move downwardly.

Figure 36D:
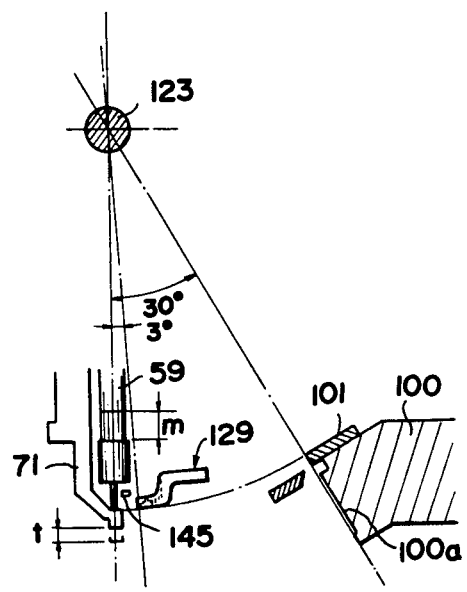

As shown in FIG. 36d, the lower slider frame member 49 is lifted up a distance t by the first step of the cam 45 for vertically moving the lower slider frame, and the top ends of the inserting guides 71 receive and hold the lead 10 of the electronic component 1. Simultaneously, the sleeve 57 is brought down by the inclined face of the cam 44 to vertically move the press bar. The lower press bar 59 is brought down and the lead of the electronic component 1 is pressed and tightly held by the lower end of said lower press bar. While the rollers 55 and 65 are located in the plane face portion of the cam, the inclined face of the chuck lever return cam 46 presses the roller 125 and the chuck lever 127 begins to return.

At this point, the chuck lever 127 begins to rotate, but since the hook 155 of the wiper lever 126 is caught on the stopper 152 of the cam lever 153, as shown in FIG. 29, said wiper lever is prevented from rotating and the lock cam 156 forces out the lock lever 158 to premit said chuck lever alone to rotate. The chuck mechanism 129 is then ready to draw back the lead 10, but since the wiper 145 is still left just behind said lead, said lead is caused to abut said wiper with only a slight deformation. Accordingly, breakage or significant deformation of the lead 10 is prevented, and the chuck mechanism may be reliably removed at a high speed. Furthermore, the structure of the chuck mechanism itself may be simplified.

When the chuck lever 127 arrives at a position of a specific phase angle such as, for example, 3°, or a retraction distance of 3 mm, the projection 154 raises the cam lever 153 to remove the hook 155 of the wiper lever 126 from the stopper 152. The wiper lever 126 is thereby returned to the original position in follow-up with the chuck lever 127 by the lock lever 158, while maintaining the phase difference of 3° or 3 mm. Before the initiation of the return movement of the chuck lever 127, the cam operating cylinder 104 is contracted to lift up the lever 170 to prevent interference by said lever with the return movement of said chuck lever.

After the upper slider frame member 38 has arrived at the lowermost point, it rises again. The chuck lever return cam 46 also rises, and the roller 125 separates from the cam 46. However, the chuck lever 127 is set at a position corresponding to a phase angle of 33° by the action of the spring 161, as shown in FIG. 28.

The foregoing procedures are repeated to successively transfer electronic components, one by one.

The operation of devices other than the transfer device 35 will now be described.

After the electronic component 1 has been held by the upward movement of the inserting guides 71 for the distance t and by the downward movement of the lower push bar 59 for the distance m, according to the aforedescribed operation of the transfer device 35, the upper slider frame member 38 further continues the downward movement. Both rollers 55 and 65 pass through the plane face portion of the cam and ride over the inclined face portion, and the inserting guides 71 and the lower push bar 59 are brought down at the same speed. When the lower ends of the inserting guides 71 are going to fall into abutment with the printed circuit board 8, the downward movement of the lower slider frame member 49 is stopped by the stopper and said lower ends of said inserting guides are stopped slightly above said printed circuit board. Although the upper slider frame member 38 still continues the downward movement, since there is no longer any restraint imposed on the roller 55, the lower slider frame member 49 is kept stationary, that is, the inserting guides 71 are kept stationary. In this stage, the lower push bar 59 continues the downward movement, and the electronic component 1 is inserted into a predetermined hole of the printed circuit board 8.

In the table unit 22, a lead cutting and bending member of the type disclosed in, for example, U.S. Pat. No. 4,054,988, U.S. Pat. application Ser. No. 860,415 DT-OS 2614002 or DT-OS 2755290, is positioned on the back surface of the printed circuit board 8 to cut off the excessive portion of the lead 10 projecting from said back surface and bend the cut end of said lead to prevent said lead from falling out. The electronic component 1 is thus affixed to the printed circuit board 8.

During the step of inserting the electronic component 1 into the printed circuit board 8, the inserting guide opening and closing cam 47 abuts the roller 75, and the guide opening lever 76 is operated to open the inserting guides 71 and release said electronic component.

When the limit switch detects the arrival of the upper slider frame member 38 at the lower end of the stroke, the solenoid 99 (FIG. 13) for opening the ratchet stopper 97 (FIGS. 19 and 20) is actuated to open said ratchet stopper via the connecting link 98 to set the ratchet wheel 82 free. The upper slider frame member 38 then rises. The lower slider frame member 49 is raised with the rising movement of the upper slider frame member 38 to lift up the inserting guides 71. When the roller 75 of the guide opening lever 76 separates from the inserting guide opening and closing cam 47, the guide closing lever 78 brings down the operating rod 77 to return the inserting guides 71.

The rising movement of the upper slider frame member 38 causes the shaft 87 to rotate through the links 85 and 86. The rotary force is transmitted by the one-way clutch 90 to rotate the ratchet wheel 82 intermittently by one pitch.

When the electronic component 1 is transferred to the guide face 100a of the guide block 100, the tooth absence detecting lever 119 (FIGS. 25 and 26) checks. When the presence of the electronic component 1 is detected, the power source of the solenoid 99 (FIG. 13) for opening the ratchet stopper 97 is deactuated and the ratchet 96 is stopped by said ratchet stopper 97. The ratchet wheel 82 is thus prevented from rotation.

When the upper slider frame member 38 rises further, the link 86 is further lifted up to rotate the shaft 87. However, a slip is produced by the action of the slip clutch 93 and the ratchet wheel 82 is no longer advanced, but is stopped at a specific position.

The upper slider frame member 38 stops at the highest point of the stroke. At such time, a signal for starting the cam operating cylinder 104 is emitted and the aforedescribed procedures are repeated.

As is apparent from the foregoing description, in accordance with the invention, the speed of inserting electronic components may be considerably increased. Approximately 1 second, for example, is required by the conventional technique for the insertion of one electronic component. The machine of the invention, however, inserts one electronic component within $\frac{1}{3}$ to $\frac{1}{4}$ second. The automatic inserting machine of the invention thus has a considerably increased operating capacity. Furthermore, the automatic inserting machine of the invention has a greatly enhanced reliability in the operation of inserting electronic components. The machine of the invention thus attains very high practical effects and advantages.

The invention is by no means restricted to the aforementioned details which are described only as examples; they may vary within the framework of the invention, as defined in the following claims.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In a machine for processing and inserting parallel lead electronic components from an electronic component web carrier into lead receiving openings in a printed circuit board, insert means for receiving an electronic component at a predetermined position and inserting the electronic component into the printed circuit board, said insert means including an insert subassembly having
    a frame;
    first slider means slidably mounted on the frame;
    driving means mounted on said frame for driving the first slider means;
    second slider means slidably mounted on said frame and cooperating with movement of said first slider means, said second slider means including lead inserting and guiding means for holding and guiding the electronic component and push bar means for displacing the electronic component from the predetermined position to an inserted position under the control of the lead inserting and guiding means;
    intermittent drive means;
    feed means mounted on said frame and driven by the intermittent drive means for feeding the electronic component web carrier intermittently, pitch by pitch, said feed means including a feed member for receiving and feeding said electronic component web carrier while maintaining electronic components of said electronic component web carrier substantially vertically and a holding member for holding the electronic components in an oblique orientation to the vertical direction;
    cutting means for separating one electronic component from said electronic component web carrier fed by the feed means while the electronic component is being held by said holding member in an oblique orientation; and
    transfer means including reciprocating means for producing reciprocative movements between the cutting means and said lead inserting and guiding means, and electronic component holding means for holding a lead of the electronic component to be separated by said cutting means while the electronic component is being held by said holding member in an oblique orientation and transferring said electronic component to said lead inserting and guiding means after said electronic component has been separated by said cutting means whereupon the transferred electronic component is situated in a substantially vertical orientation.

2. A machine as claimed in claim 1, wherein said intermittent drive means is an intermittent drive mechanism including a one-way clutch for transmitting vertical movement of said first slider means via the clutch and feeding said electronic component web carrier only at the time of vertical movement of said first slider means.

3. A machine as claimed in claim 1, wherein said cutting means includes rotary cam having a central shaft on said frame, a cam operating cylinder operating the rotary cam, and a lever device having a fulcrum on said frame.

4. A machine as claimed in claim 1, wherein the reciprocating means of said transfer means comprises a rotating swinging reciprocating mechanism.

5. A machine as claimed in claim 1, wherein the feed member of said feed means includes a ratchet wheel having a projection on the surface thereof and a substantially vertical shaft rotatably supporting the ratchet wheel.

6. A machine as claimed in claim 1, wherein the holding member holds the electronic components at an angle of inclination of 15° to 45°.

7. In a machine for processing and inserting parallel lead electronic components from an electronic component web carrier into lead receivng openings in a printed circuit board, insert means for receiving an electronic component at a predetermined position and inserting the electronic component into the printed circuit board, said insert means including an insert subassembly having
    a frame;
    first slider means slidably mounted on the frame;
    driving means mounted on said frame for driving the first slider means;
    second slider means slidably mounted on said frame and cooperating with movement of said first slider means, said second slider means including lead inserting and guiding means for holding and guiding the electronic component and push bar means for displacing the electronic component from the predetermined position to an inserted position under the control of the lead inserting and guiding means;
    intermittent drive means;
    feed means mounted on said frame and driven by the intermittent drive means for feeding the electronic component web carrier intermittently, pitch by pitch;
    cutting means for separating one electronic component from said electronic component web carrier fed by the feed means; and
    transfer means including reciprocating means for producing reciprocative movements between the cutting means and said lead inserting and guiding means, and electronic component holding means for holding a lead of the electronic component to be separated by said cutting means and transferring said electronic component to said lead inserting and guiding means after said electronic component has been separated by said cutting means, said transfer means including a horizontal shaft, a chuck lever rotatably supported around the horizontal shaft, a chuck mechanism held by the chuck lever, a wiper lever rotatably supported around said horizontal shaft and a wiper mechanism mounted on said wiper lever.

8. A machine as claimed in claim 7, wherein the chuck mechanism of said transfer means includes a fixed click having spaced substantially parallel opposite sides, a spring and a pair of movable clicks adapted to grasp said fixed click from both sides of said fixed click via the force of the spring, said movable clicks having grooves formed therein for nipping the lead of an electronic component therein, and the wiper mechanism of said transfer means includes a wiper and a lead press bar, said wiper and lead press bar being arranged so that they are positionable on both sides of the lead of an electronic component grasped by said chuck mechanism, a connecting mechanism, said chuck lever and said wiper lever being restrained by each other via said connecting mechanism so that said chuck lever and said wiper lever may make relative movements within a predetermined angle range and may move at the same speed, and said lead press bar being arranged so that it is retractable to a position in which it remains out of contact with the lead of the electronic component even if said wiper lever is rotated.

9. A machine as claimed in claim 7, wherein said chuck mechanism is rotatably mounted on said chuck lever.

10. A machine as claimed in claim 8, wherein said connecting mechanism comprises a link cam mechanism for moving said wiper lever in dependence on the movement of said chuck lever.

11. A machine as claimed in claim 10, wherein said link cam mechanism includes a delay cam mechanism for delaying the time of initiation of the return movement of said wiper lever after the time of initiation of the return movement of said chuck lever, the return movement of said chuck lever being initiated after said chuck mechanism has transferred the electronic component to said lead inserting and guiding means.

12. A machine as claimed in claim 10, wherein said link cam mechanism includes a phase difference cam for maintaining said chuck lever and said wiper lever at a predetermined angular difference.

13. A machine as claimed in claim 10, wherein the reciprocating means of said transfer means includes a feed-out mechanism for feeding out said chuck lever and a return mechanism for returning sid chuck mechanism, and said link cam mechanism causes the reciprocative movement of said wiper lever to be dependent upon the movement of said chuck lever.

14. A machine as claimed in claim 13, wherein the feed-out mechanism of said reciprocating means of said transfer means includes a rotary cam having a central shaft on said frame, a cam operating cylinder operating the rotary cam, and a lever-gear mechanism having a fulcrum on said frame.

15. A machine as claimed in claim 13, wherein said return mechanism includes a cam mounted on said first slider means and a lever device having a fulcrum on said frame.

* * * * *